(12) United States Patent
Chang

(10) Patent No.: US 12,256,610 B2
(45) Date of Patent: Mar. 18, 2025

(54) DOUBLE-SIDED E-PAPER DISPLAY PANEL AND OPERATING METHOD OF DISPLAY DEVICE

(71) Applicant: Wistron Corporation, New Taipei (TW)

(72) Inventor: Yao-Tsung Chang, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 18/503,163

(22) Filed: Nov. 6, 2023

(65) Prior Publication Data

US 2024/0074255 A1 Feb. 29, 2024

Related U.S. Application Data

(62) Division of application No. 16/903,357, filed on Jun. 16, 2020, now Pat. No. 11,856,824.

(30) Foreign Application Priority Data

Apr. 8, 2020 (TW) .................................. 109111732

(51) Int. Cl.
| | |
|---|---|
| *G02F 1/167* | (2019.01) |
| *G02F 1/1333* | (2006.01) |
| *G02F 1/1343* | (2006.01) |
| *G06F 1/16* | (2006.01) |

(Continued)

(52) U.S. Cl.
CPC ..... *H10K 59/128* (2023.02); *G02F 1/133305* (2013.01); *G02F 1/134309* (2013.01); *G06F 1/1652* (2013.01); *H10K 50/826* (2023.02); *G02F 1/133342* (2021.01)

(58) Field of Classification Search
None
See application file for complete search history.

(56) References Cited

U.S. PATENT DOCUMENTS

| | | | |
|---|---|---|---|
| 6,819,309 | B1 | 11/2004 | Kishi |
| 8,154,790 | B2 | 4/2012 | Wang |

(Continued)

FOREIGN PATENT DOCUMENTS

| | | |
|---|---|---|
| CN | 103353701 A | 10/2013 |
| CN | 109188821 A | 1/2019 |

(Continued)

*Primary Examiner* — Thanh Nhan P Nguyen
(74) *Attorney, Agent, or Firm* — Winston Hsu

(57) ABSTRACT

Disclosed is a double-sided e-paper display panel including a first substrate, a second substrate, alight isolation layer, a first display medium layer, a second display medium layer, a first electrode layer, and a second electrode layer. The second substrate and the first substrate are disposed opposite to each other. The light isolation layer is disposed between the first substrate and the second substrate. The first display medium layer is disposed between the first substrate and the light isolation layer. The second display medium layer is disposed between the light isolation layer and the second substrate. The first display medium layer and the second display medium layer include a fluid and a plurality of charged particles. The first electrode layer is disposed between the first substrate and the first display medium layer. The second electrode layer is disposed between the second display medium layer and the second substrate.

3 Claims, 11 Drawing Sheets

(51) Int. Cl.
 *H10K 50/826* (2023.01)
 *H10K 59/128* (2023.01)

(56) References Cited

U.S. PATENT DOCUMENTS

2008/0198443  A1    8/2008  Yoshimura
2016/0238917  A1    8/2016  Zhang

FOREIGN PATENT DOCUMENTS

JP      2008-292839 A     12/2008
KR   10-2008-0049523 A     6/2008

DOUBLE-SIDED E-PAPER DISPLAY PANEL AND OPERATING METHOD OF DISPLAY DEVICE

CROSS REFERENCE TO RELATED APPLICATIONS

This application is a division of U.S. application Ser. No. 16/903,357, filed on Jun. 16, 2020. The content of the application is incorporated herein by reference.

BACKGROUND OF THE INVENTION

1. Field of the Invention

The present invention relates to an e-paper display panel, a display device and an operating method of the display device; more particularly, to an e-paper display panel and a display device capable of double-sided display and an operating method of the display device.

2. Description of the Prior Art

Current display devices take many forms, such as liquid crystal display devices, organic light-emitting diode display devices or electronic paper (e-paper) display devices. Because e-paper display devices utilize environmental light as a light source, such devices do not require active lighting; furthermore, such devices may continue to display content when turned off, thereby becoming the most energy-efficient technology among display devices currently available while having displayed images most similar to those shown on paper. However, current e-paper display devices are single-sided displays and are unable to display double-sided images, thereby limiting their field of applications.

SUMMARY OF THE INVENTION

According to an embodiment of the present disclosure, a type of double-sided e-paper display panel is provided, including a first substrate, a second substrate, a light isolation layer, a first display medium layer, a second display medium layer, a first electrode layer, and a second electrode layer. The second substrate is disposed opposite to the first substrate. The light isolation layer is disposed between the first substrate and the second substrate. The first display medium layer is disposed between the first substrate and the light isolation layer. The second display medium layer is disposed between the light isolation layer and the second substrate. The first display medium layer and the second display medium layer include a fluid and a plurality of charged particles. The first electrode layer is disposed between the first substrate and the first display medium layer. The second electrode layer is disposed between the second display medium layer and the second substrate.

According to another embodiment of the present disclosure, a type of double-sided e-paper display panel is provided, including a first substrate, a second substrate, a display medium layer, a first light-isolation pattern layer, a second light-isolation pattern layer, a first electrode layer and a second electrode layer. The second substrate is disposed opposite to the first substrate. The display medium layer is disposed between the first substrate and the second substrate. The first light-isolation pattern layer is disposed on a surface of the first substrate opposite to the display medium layer, the second light-isolation pattern layer is disposed on a surface of the second substrate opposite to the display medium layer, and the first light-isolation pattern layer does not overlap at least a portion of the second light-isolation pattern layer in a top-view direction. The first electrode layer is disposed between the first substrate and the display medium layer, and the second electrode layer is disposed between the display medium layer and the second substrate.

According to yet another embodiment of the present disclosure, an operating method of a display device is provided, wherein the display device includes a double-sided e-paper display unit, a control unit, a driving unit and an input unit. The control unit is electrically connected via the driving unit to the double-sided e-paper display unit, and the input unit is electrically connected to the control unit. First, display information is received via the input unit. Then, a display mode of the double-sided e-paper display unit is determined via the control unit based on the display information. When the control unit determines the display mode to be a single-sided display mode, the double-sided e-paper display unit is driven via the driving unit based on the display information to display an image on a display surface of the double-sided e-paper display unit. When the control unit determines the display mode to be a double-sided display mode, the double-sided e-paper display unit is driven via the driving unit based on the display information to display images on the display surface and another display surface of the double-sided e-paper display unit.

These and other objectives of the present invention will no doubt become obvious to those of ordinary skill in the art after reading the following detailed description of the preferred embodiment that is illustrated in the various figures and drawings.

DETAILED DESCRIPTION

The present disclosure may be understood by reference to the following detailed description, taken in conjunction with the embodiments and drawings as described below. It is noted that, for purposes of illustrative clarity and being easily understood by the readers, various drawings of this invention (disclosure) may be simplified schematic diagrams; certain elements within may not be drawn to scale. In addition, the number and dimension of each element shown in drawings are illustrative and are not intended to limit the scope of the present disclosure.

Figure 1:
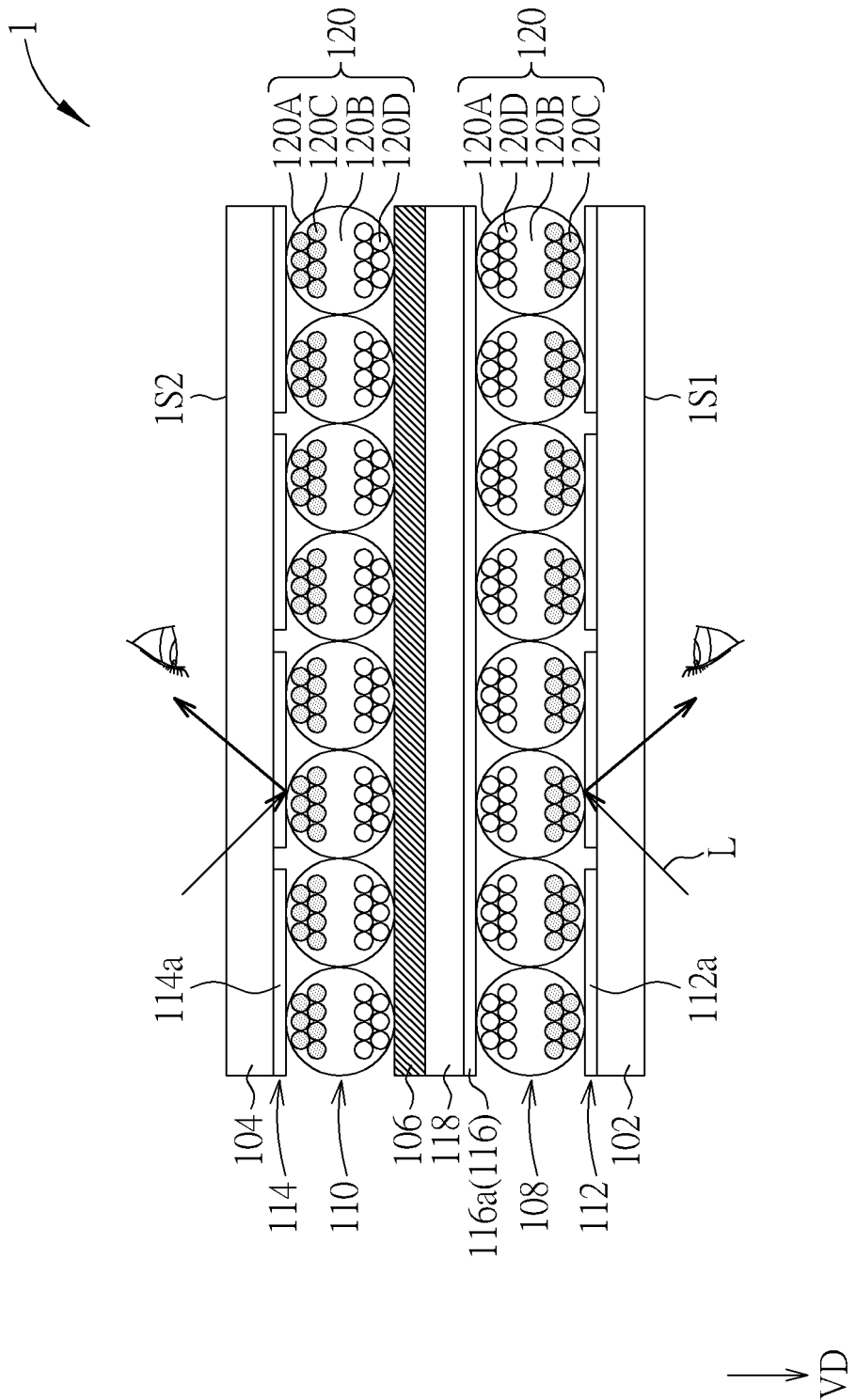
FIG. 1 schematically illustrates a cross-sectional view of a double-sided e-paper display panel according to a first embodiment of the present invention (disclosure).

Please refer to FIG. 1, which schematically illustrates a cross-sectional view of a double-sided e-paper display panel according to a first embodiment of the present invention (disclosure). As shown in FIG. 1, the double-sided e-paper display panel 1 of the present embodiment has two display surfaces 1S1, 1S2 opposite to each other, and the double-sided e-paper display panel 1 may display images on the display surface 1S1 and the display surface 1S2. Practically, the double-sided e-paper display panel 1 includes a first substrate 102, a second substrate 104, a light isolation layer 106, a first display medium layer 108, a second display medium layer 110, a first electrode layer 112, a second electrode layer 114 and a third electrode layer 116. The first substrate 102 is disposed opposite to the second substrate 104, and the first substrate 102 and the second substrate 104 may for example include flexible or non-flexible (rigid) transparent substrates. Materials of the first substrate 102 and the second substrate 104 may for example include glass, ceramic, quartz, sapphire, acrylic, polyimide (PI), polyethylene terephthalate (PET), other suitable materials or a combination of abovementioned materials, but the present disclosure is not limited thereto. In the present embodiment, a surface of the first substrate 102 opposite to the second substrate 104 may serve as the display surface 1S1 for displaying an image, and a surface of the second substrate 104 opposite to the first substrate 102 may serve as the display surface 1S2 for displaying another image, but the present disclosure is not limited thereto.

The light isolation layer 106 is disposed between the first substrate 102 and the second substrate 104, and is used to isolate or absorb light entering from the display surface 1S1 and through the first display medium layer 108 and light entering from the display surface 1S2 and through the second display medium layer 110. In the present embodiment, the double-sided e-paper display panel 1 may further include a third substrate 118 disposed between the first substrate 102 and the second substrate 104, and the light isolation layer 106 is disposed on a surface of the third substrate 118 facing the second substrate 104, but the present disclosure is not limited thereto. The material of the third substrate 118 may be similar or identical to material of the first substrate 102 or the second substrate 104, but the present disclosure is not limited thereto. In some embodiments, the light isolation layer 106 may also be disposed on a surface of the third substrate 118 facing the first substrate 102. The light isolation layer 106 may for example be a black material or a white material, wherein the black material may for example include black photoresist materials or black thin film materials, and the white material may for example include white photoresist materials or white thin film materials, but the present disclosure is not limited thereto. A color of the light isolation layer 106 may determine a background color of the image; for example, when the light isolation layer 106 is a black material, the background color of the image may be black, and patterns shown in the image may be white; on the other hand, when the light isolation layer 106 is a white material, the background color of the image may be white, and patterns shown in the image may be black, but the present disclosure is not limited thereto. The color of the light isolation layer 106 may be based on design requirements. The light isolation layer 106 may for example be formed on the third substrate 118 via coating or adhering, but the present disclosure is not limited thereto.

The first display medium layer 108 is disposed between the first substrate 102 and the light isolation layer 106, the second display medium layer 110 is disposed between the light isolation layer 106 and the second substrate 104. The first display medium layer 108 and the second display medium layer 110 may include a fluid 120B and a plurality of charged particles. In the present embodiment, the first display medium layer 108 and the second display medium layer 110 may each include a plurality of microcapsules 120, and each microcapsule 120 may include a shell 120A, a portion of the fluid 120B and a plurality of charged particles. Wherein, the shell 120A encloses the portion of the fluid 120B, and charged particles are dispersed in the fluid 120B. The shell 120A may for example include polymer materials or other suitable materials, the charged particles may for example include titanium dioxide or other suitable materials, and the fluid 120B may for example be a liquid that may for example include ink, but the present disclosure is not limited thereto. Therefore, the double-sided e-paper display panel 1 of the present embodiment may be a microcapsule type electrophoretic display panel, but the present disclosure is not limited thereto. For example, charged particles may include a plurality of positively charged particles 120C and a plurality of negatively charged particles 120D, and the positively charged particles 120C have a different color than the negatively charged particles 120D. In an embodiment of a single-color display, one type of the positively charged particles 120C and the negatively charged particles 120D may for example be white, and the other type of the positively charged particles 120C and the negatively charged particles 120D may for example be black, but the present disclosure is not limited thereto. In such scenario, the fluids 120B may be transparent or black, but the present disclosure is not limited thereto. The positively charged particles 120C and the negatively charged particles 120D of the present disclosure may be other suitable colors based on practical demands. In some embodiments, the charged particles may also be positively charged particles with an identical color or negatively charged particles with an identical color, and the color of the charged particles may be different from the color of the fluid 120B; for example, the charged particles may be white, and the fluid 120B may be black.

The first electrode layer 112 is disposed between the first substrate 102 and the first display medium layer 108, the second electrode layer 114 is disposed between the second display medium layer 110 and the second substrate 104, and the third electrode layer 116 is disposed between the first display medium layer 108 and the light isolation layer 106. In the present embodiment, the third substrate 118 is disposed between the third electrode layer 116 and the light isolation layer 106, such that the third electrode layer 116 may be formed on a surface of the third substrate 118 opposite to the light isolation layer 106, but the present disclosure is not limited thereto. In some embodiments, the third electrode layer 116 may be between the third substrate 118 and the light isolation layer 106 or between the light isolation layer 106 and the second display medium layer 110. Materials of the first electrode layer 112, the second electrode layer 114 and the third electrode layer 116 may include transparent conductive materials that allow light to pass through; for example, transparent conductive materials may include indium tin oxide, indium zinc oxide or other suitable conductive materials.

In the present embodiment, the first electrode layer 112 may include a plurality of first electrodes 112a separated from each other and disposed on a surface of the first substrate 102 opposite to the second substrate 104, and the first electrodes 112a may for example be arranged in an array. The second electrode layer 114 may include a plurality of second electrodes 114a separated from each other and disposed on a surface of the second substrate 104 opposite to the first substrate 102, and the second electrodes 114a may for example be arranged in an array. Even though it is not illustrated in FIG. 1, the first substrate 102 and the second substrate 104 may include active matrix circuits or passive matrix circuits that are electrically connected to the first electrodes 112a and the second electrodes 114a and providing voltages to the first electrodes 112a and the second electrodes 114a. The third electrode layer 116 may include a first common electrode 116a that overlaps the first electrodes 112a and the second electrodes 114a in a top-view direction VD perpendicular to the display surface 1S1 or the display surface 1S2. In such manner, the charged particles between the first electrodes 112a and the first common electrode 116a may be controlled by a voltage difference between the first electrodes 112a and the first common electrode 116a, and the charged particles between the second electrodes 114a and the first common electrode 116a may be controlled by a voltage difference between the second electrodes 114a and the first common electrode 116a. In the present embodiment, the first electrodes 112a may overlap the plurality of microcapsules 120 of the first display medium layer 108 in the top-view direction VD, but the present disclosure is not limited thereto. In some embodiments, one of the microcapsules 120 of the first display medium layer 108 may overlap one first electrode 112a or a plurality of the first electrodes 112a in the top-view direction VD.

For example, as shown in FIG. 1, when the positively charged particles 120C are black, and the negatively charged particles 120D are white, by applying a negative voltage at the first electrodes 112a lower than a voltage at the first common electrode 116a (such as a ground voltage), the positively charged particles 120C would be attracted by the first electrodes 112a and move toward the first electrodes 112a, and the negatively charged particles 120D would be attracted by the first common electrode 116a and move toward the first common electrode 116a. Therefore, light L entering from the display surface 1S1 may be reflected by the black positively charged particles 120C such that images displayed on the display surface 1S1 of the double-sided e-paper display panel 1 are shown with a color of a dark state or close to a dark state. On the other hand, when a positive voltage applied at the first electrodes 112a is higher than the voltage at the first common electrode 116a (such as the ground voltage), images displayed on the display surface 1S1 of the double-sided e-paper display panel 1 are shown with a color of a bright state or close to a bright state. By adjusting a magnitude of the voltage difference, a length of time to apply the voltage difference, a number of times to apply the voltage difference or a timing sequence of the voltage difference between the first electrodes 112a and the first common electrode 116a, a quantity of the black positively charged particles 120C adjacent to the first electrodes 112a and a quantity of the white negatively charged particles 120D adjacent to the first common electrode 116a may be controlled, thereby producing images with different grayscales. In the same manner, images displayed on the display surface 1S2 of the double-sided e-paper display panel 1 may be controlled via the voltage difference between the second electrodes 114a and the first common electrode 116a. Display surfaces 1S1, 1S2 may thereby display independent images, and more applications for the double-sided e-paper display panel 1 may be available. Furthermore, the double-sided e-paper display panel 1 of the present embodiment, when compared to simply assembling two stand-alone single-side e-paper display panels back-to-back, does not require a substrate, a light isolation layer, an electrode layer and other control elements; therefore, a device thickness in the top-view direction VD may be reduced along with a material cost and a production cost.

Embodiments of the double-sided e-paper display panel are not limited to those outlined above; different embodiments may be realized according to the present disclosure. For simplicity, different embodiments described below will refer to elements identical to those in the first embodiment using the same reference signs. The following paragraphs will describe various differences between the first embodiment and other embodiments, and will no longer repeat descriptions regarding identical elements in detail.

Figure 2:
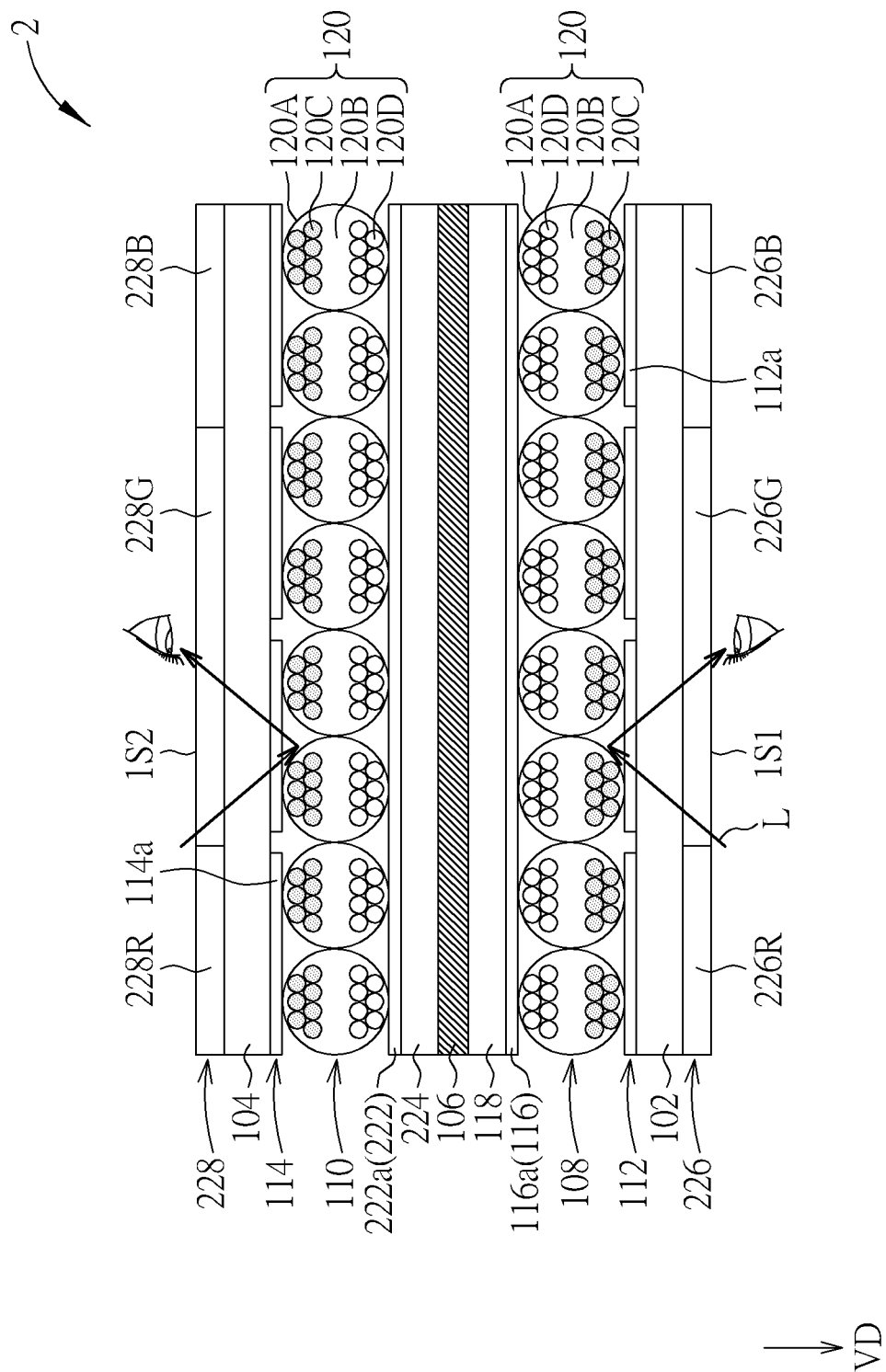
FIG. 2 schematically illustrates a cross-sectional view of the double-sided e-paper display panel according to a second embodiment of the present invention (disclosure).

Please refer to FIG. 2, which schematically illustrates a cross-sectional view of the double-sided e-paper display panel according to a second embodiment of the present invention (disclosure). As shown in FIG. 2, a double-sided e-paper display panel 2 of the present embodiment is different from the double-sided e-paper display panel 1 shown in FIG. 1 in that, the double-sided e-paper display panel 2 of the present embodiment further includes a fourth electrode layer 222 disposed between the light isolation layer 106 and the second display medium layer 110. Practically, the fourth electrode layer 222 may include a second common electrode 222a, and an image displayed on the display surface 1S2 may be controlled via a voltage difference between the second electrodes 114a and the second common electrode 222a, while an image displayed on the display surface 1S1 may still be controlled via the voltage difference between the first electrodes 112a and the first common electrode 116a. The material of the fourth electrode layer 222 may include a transparent conductive material that allows light to pass through; for example, the transparent conductive material may include indium tin oxide, indium zinc oxide or other suitable conductive materials. In some embodiments, the double-sided e-paper display panel 2 may further include a fourth substrate 224 disposed between the fourth electrode layer 222 and the light isolation layer 106, so that the fourth electrode layer 222 may be formed on a surface of the fourth substrate 224 facing the second substrate 104, and the light isolation layer 106 may be disposed between the third substrate 118 and the fourth substrate 224, but the present disclosure is not limited thereto. The material of the fourth substrate 224 may be similar or identical to the material of the first substrate 102 or the second substrate 104, but the present disclosure is not limited thereto. In some embodiments, the fourth electrode layer 222 may also be formed on a surface of the fourth substrate 224 facing the third substrate 118.

In some embodiments, the double-sided e-paper display panel 2 may further include a color filter layer 226 disposed on a surface of the first substrate 102 opposite to the second substrate 104, so that full color images may be displayed on the display surface 1S1 of the double-sided e-paper display panel 2. A surface of the color filter layer 226 opposite to the first substrate 102 may serve as the display surface 1S1, but the present disclosure is not limited thereto. As examples, the color filter layer 226 may include a red color filter 226R, a green color filter 226G and a blue color filter 226B. In some embodiments, another color filter layer 228 may be disposed on a surface of the second substrate 104 opposite to the first substrate 102. A surface of the color filter layer 228 opposite to the second substrate 104 may serve as the display surface 1S2, but the present disclosure is not limited thereto. In some embodiments, the color filter layers 226, 228 may also be applied in the double-sided e-paper display panel 1 shown in FIG. 1 or any one of the embodiments described below.

Figure 3:
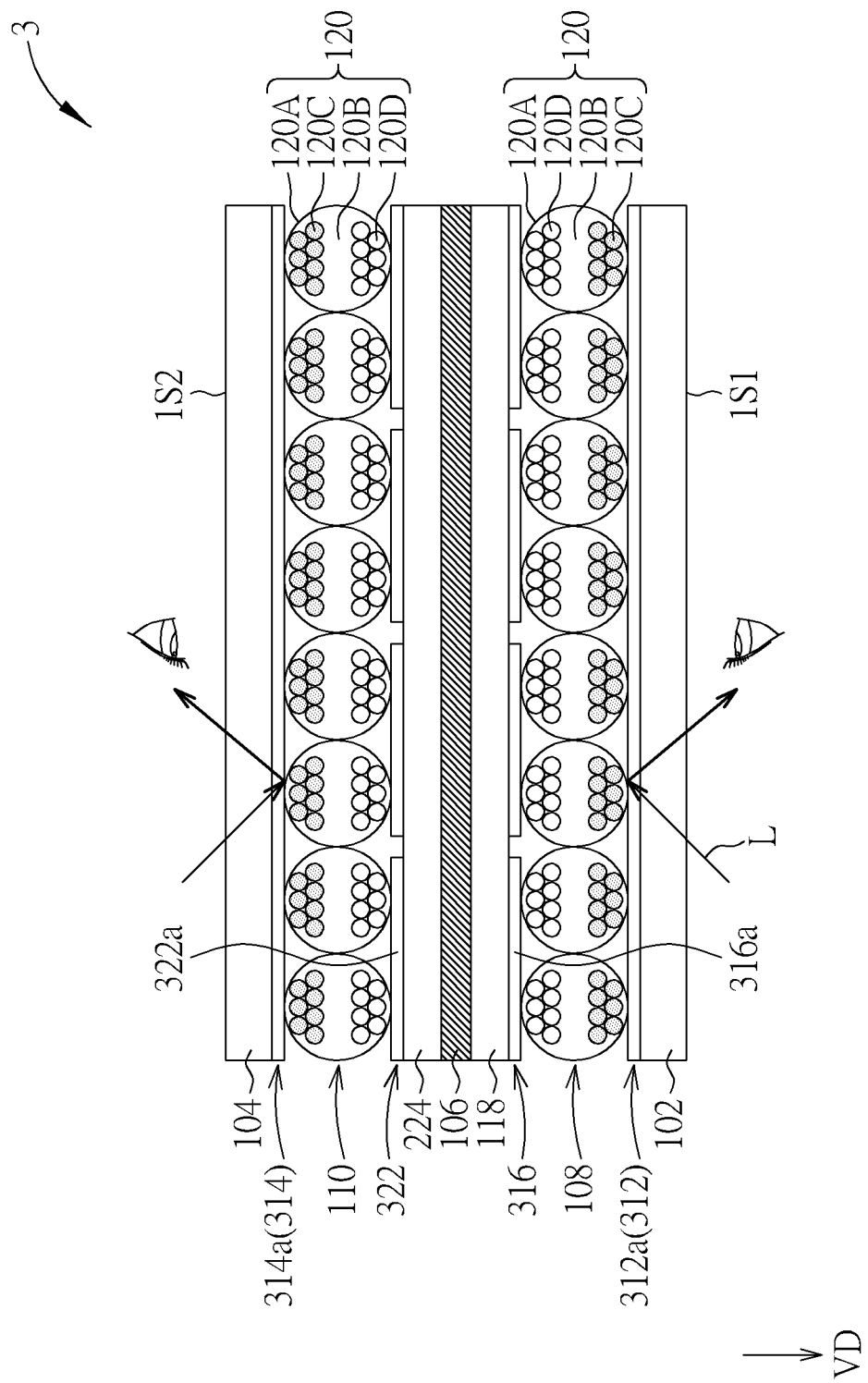
FIG. 3 schematically illustrates a cross-sectional view of the double-sided e-paper display panel according to a third embodiment of the present invention (disclosure).

Please refer to FIG. 3, which schematically illustrates a cross-sectional view of the double-sided e-paper display panel according to a third embodiment of the present invention (disclosure). As shown in FIG. 3, a double-sided e-paper display panel 3 of the present embodiment may be a structure of the first electrode layer 112 of FIG. 2 interchanged with a structure of the third electrode layer 116 of FIG. 2, and/or a structure of the second electrode layer 114 of FIG. 2 interchanged with a structure of the fourth electrode layer 222 of FIG. 2. Practically, a first electrode layer 312 includes a first common electrode 312a, a second electrode layer 314 includes a second common electrode 314a, a third electrode layer 316 includes a plurality of first electrodes 316a, and a fourth electrode layer 322 includes a plurality of second electrodes 322a. In the present embodiment, an image displayed on the display surface 1S1 may be controlled via a voltage difference between the first electrodes 316a and the first common electrode 312a, and an image displayed on the display surface 1S2 may be controlled via a voltage difference between the second electrodes 322a and the second common electrode 314a.

Figure 4:
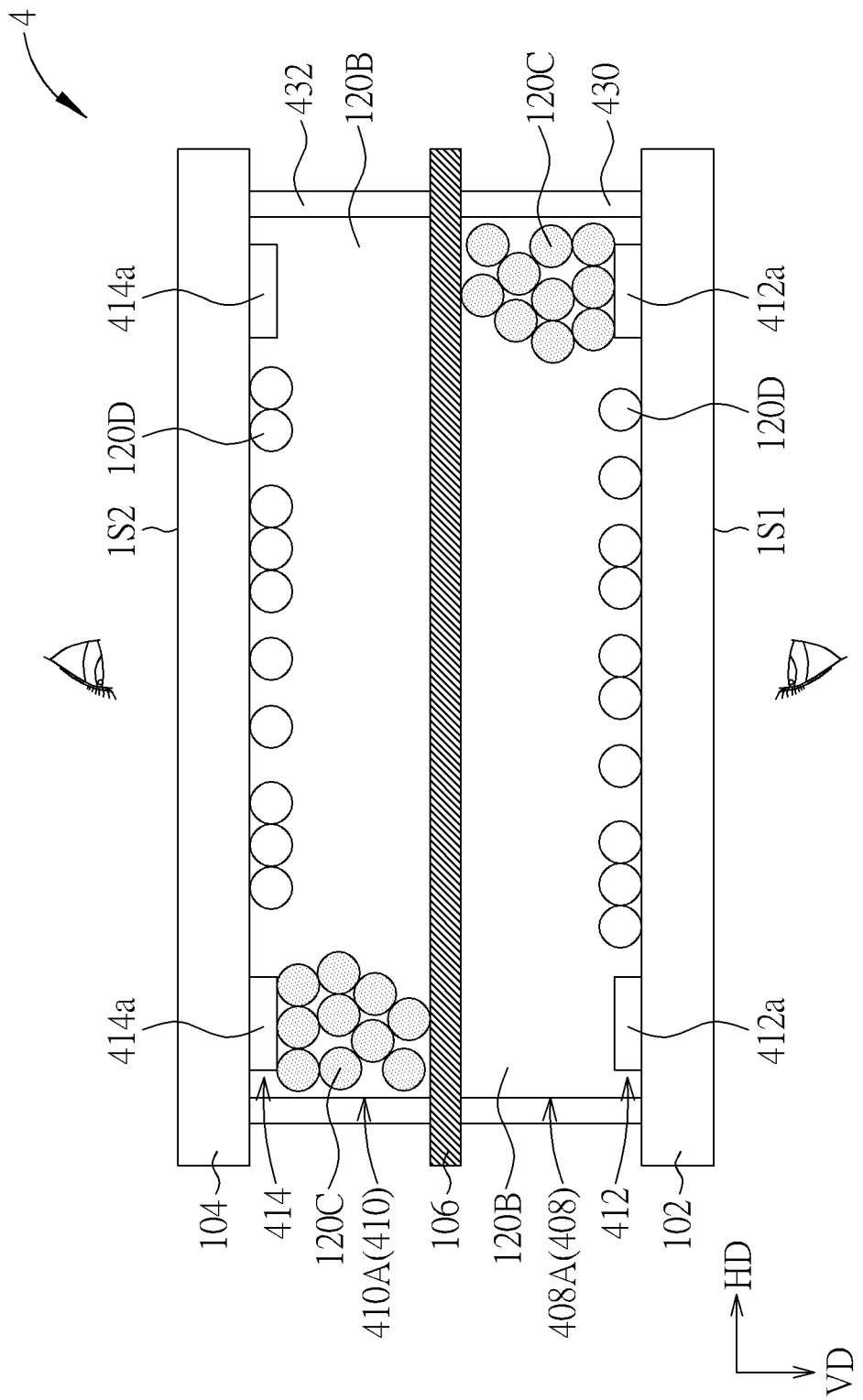
FIG. 4 schematically illustrates a cross-sectional view of the double-sided e-paper display panel according to a fourth embodiment of the present invention (disclosure).

Please refer to FIG. 4, which schematically illustrates a cross-sectional view of the double-sided e-paper display panel according to a fourth embodiment of the present invention (disclosure). As shown in FIG. 4, a double-sided e-paper display panel 4 of the present embodiment differs from the double-sided e-paper display panel 1 shown in FIG. 1 in that, a first display medium layer 408 includes a plurality of first display units 408A, and each first display unit 408A may include the fluid 120B and charged particles. For clarity, FIG. 4 only illustrates a region of the double-sided e-paper display panel 4 that corresponds to a single first display unit 408A, but the present disclosure is not limited thereto. The first display unit 408A may for example correspond to a pixel or a sub-pixel of images displayed on the display surface 1S1 of the double-sided e-paper display panel 4. The first electrode layer 412 includes a plurality of electrode pairs separated from each other and corresponding to a single first display unit 408A; each electrode pair may include two first electrodes 412a separated from each other and respectively disposed adjacent to two sides of the first display unit 408A. Furthermore, the first electrode layer 412 may include non-transparent conductive materials, such as metals or other suitable materials.

Practically, the double-sided e-paper display panel 4 may further include a plurality of first partition walls 430 disposed between the first substrate 102 and the light isolation layer 106, so as to separate the first display units 408A and form a chamber between the first substrate 102 and the light isolation layer 106 where the fluid 120B and charged particles of the first display unit 408A may be disposed. Furthermore, the first electrodes 412a corresponding to the same first display unit 408A may be disposed in the chamber and be disposed on the first substrate 102 while being adjacent to the first partition walls 430. It should be noted that, of the present embodiment, charged particles may include positively charged particles 120C and negatively charged particles 120D with different colors, and distributions in a horizontal direction HD of the positively charged particles 120C and the negatively charged particles 120D may be adjusted via a voltage difference between the first electrodes 412a and a time duration to apply the voltage difference. The horizontal direction HD is for example a direction in which the first electrodes 412a are arranged, but the present disclosure is not limited thereto. For example, when the negatively charged particles 120D are white and the positively charged particles 120C are black, a voltage difference may be applied to the first electrodes 412a, such as by applying a near-zero voltage to the first electrode 412a on a left side of FIG. 4 and a negative voltage to the first electrode 412a on a right side of FIG. 4, in order to generate an electric field in the horizontal direction. In this manner, the white negatively charged particles 120D may be arranged between the first electrodes 412a, and the black positively charged particles 120C may be arranged between one of the first electrodes 412a and the light isolation layer 106 so as to be blocked by the first electrodes 412a, thereby allowing white images to be displayed on the display surface 1S1. By applying different voltages at the first electrodes 412a, relations between the distributions in the horizontal direction and quantities of the white negatively charged particles 120D and the black positively charged particles 120C may be adjusted, thereby allowing the display surface 1S1 to display necessary grayscale images. Colors of the charged particles of the present disclosure are not limited to those mentioned above; the charged particles may have other colors. Different first display units 408A may have different colors that may mix into a white color; for example, the first display units 408A may have red and black charged particles, green and black charged particles or blue and black charged particles, so that the display surface 1S1 may display colored images.

In some embodiments, the second display medium layer 410 may also include a plurality of second display units 410A, and each second display unit 410A may include the fluid 120B and charged particles. The second electrode layer 414 includes a plurality of electrode pairs separated from each other and corresponding to a single second display unit 410A; each electrode pair may include two second electrodes 414a separated from each other and respectively disposed adjacent to two sides of a corresponding second display unit 410A. Furthermore, the second electrode layer 414 may include non-transparent conductive materials, such as metals or other suitable materials, which may be used to block the charged particles between the second electrodes 414a and the light isolation layer 106. The second display unit 410A may for example correspond to a pixel or a sub-pixel of images displayed on the display surface 1S2 of the double-sided e-paper display panel 4. Furthermore, the double-sided e-paper display panel 4 may further include a plurality of second partition walls 432 disposed between the second substrate 104 and the light isolation layer 106, so as to separate the second display units 410A from each other and form a chamber between the second substrate 104 and the light isolation layer 106 where the fluid 120B and charged particles of the second display unit 410A may be disposed. Furthermore, the second electrodes 414a corresponding to the same second display unit 410A may be disposed in the chamber and be disposed on the second substrate 104 while being adjacent to the second partition walls 432. In the present embodiment, charged particles of the second display unit 410A may include positively charged particles 120C and negatively charged particles 120D with different colors, and the distribution in the horizontal direction of the positively charged particles 120C and the negatively charged particles 120D may be adjusted via a voltage difference between the second electrodes 414a and a time duration which the voltage difference is provided, thereby allowing the display surface 1S2 to display necessary grayscale images. Because a method to display images on the second display unit 410A or to drive the second display unit 410A may be similar to or the same as that of the first display unit 408A, relevant descriptions will not be detailed herein. In some embodiments, a third substrate (such as the third substrate 118 of FIG. 3) may be disposed between the light isolation layer 106 and the first display unit 408A, and/or a fourth substrate (such as the fourth substrate 224 of FIG. 3) may be disposed between the light isolation layer 106 and the second display unit 410A, but the present disclosure is not limited thereto.

Figure 5:
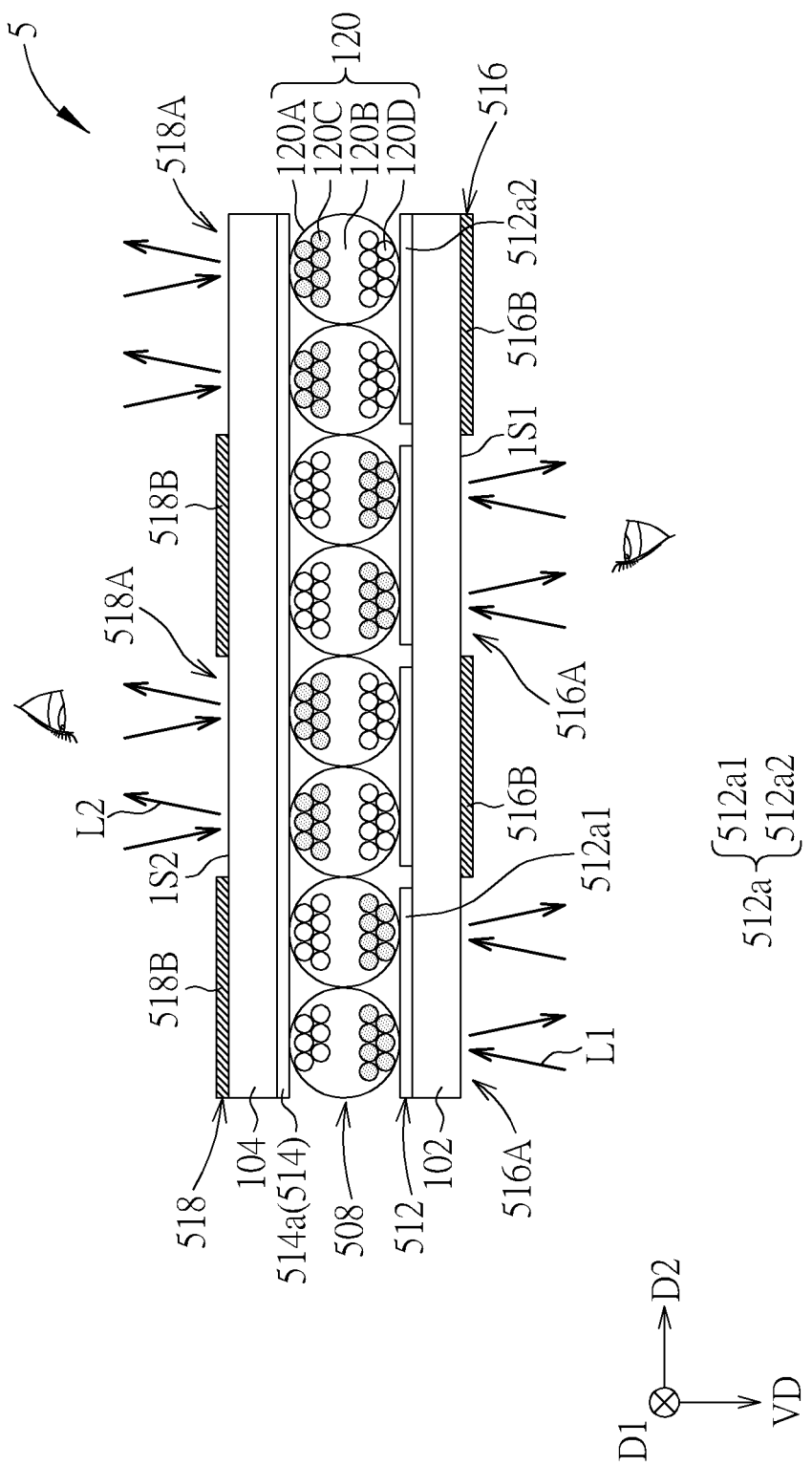
FIG. 5 schematically illustrates a cross-sectional view of the double-sided e-paper display panel according to a fifth embodiment of the present disclosure (disclosure).
Figure 6:
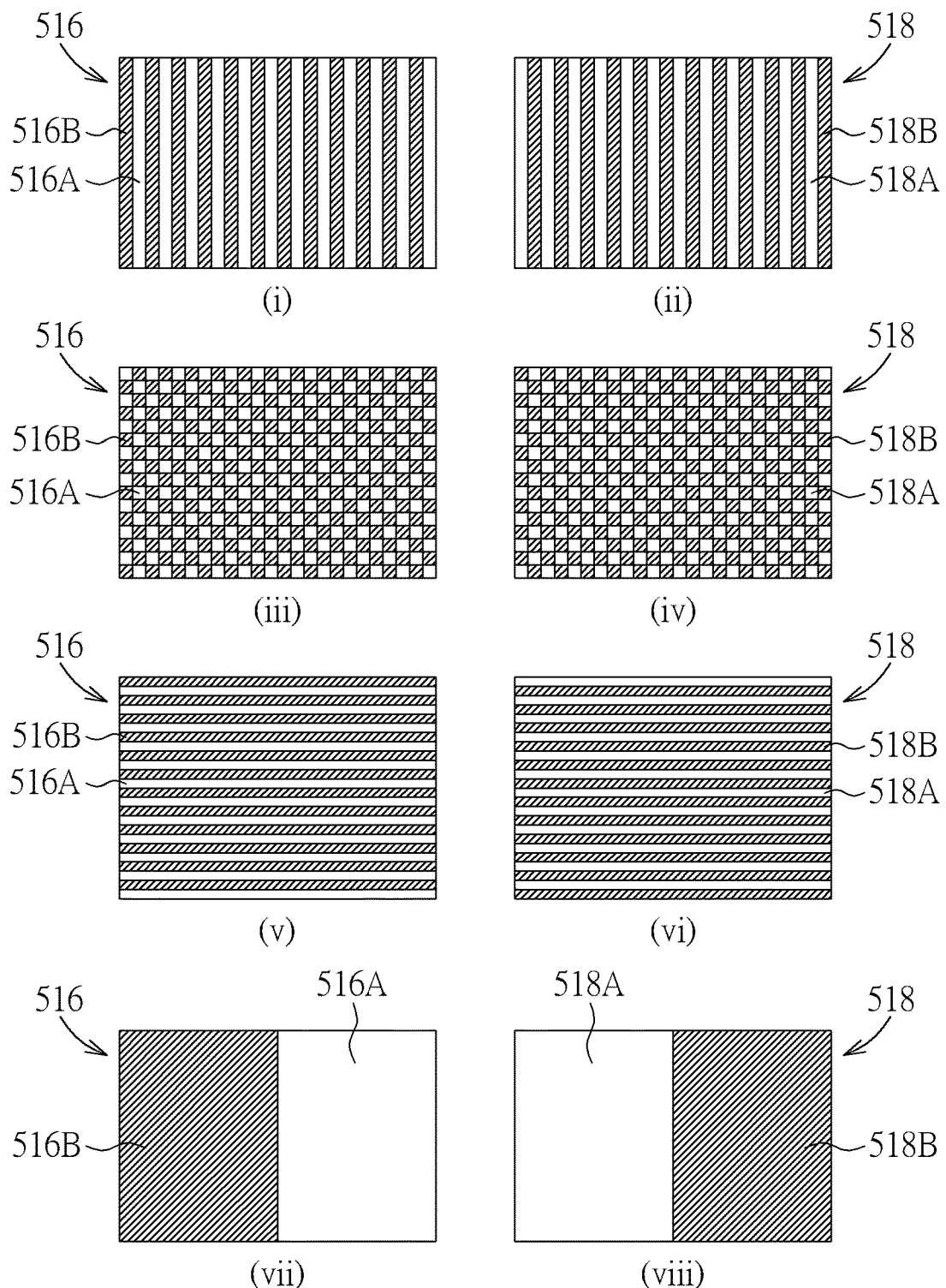
FIG. 6 schematically illustrates a plurality of top-view patterns of a first light-isolation pattern layer and a second light-isolation pattern layer according to a plurality of examples of the fifth embodiment of the present invention (disclosure).
Figure 6:
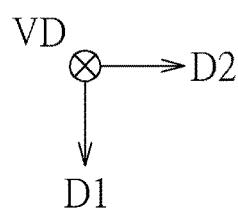

Please refer to FIG. 5 and FIG. 6. FIG. 5 schematically illustrates a cross-sectional view of the double-sided e-paper display panel according to a fifth embodiment of the present invention (disclosure), and FIG. 6 schematically illustrates a plurality of top-view patterns of a first light-isolation pattern layer and a second light-isolation pattern layer according to a plurality of examples of the fifth embodiment of the present invention (disclosure). As shown in FIG. 5, a double-sided e-paper display panel 5 of the present embodiment may include only one display medium layer 508 disposed between the first substrate 102 and the second substrate 104, thereby decreasing a thickness of the double-sided e-paper display panel 5. Practically, the double-sided e-paper display panel 5 may further include a first light-isolation pattern layer 516, a second light-isolation pattern layer 518, a first electrode layer 512 and a second electrode layer 514. The first electrode layer 512 is disposed between the first substrate 102 and the display medium layer 508, and the second electrode layer 514 is disposed between the display medium layer 508 and the second substrate 104. One of the first electrode layer 512 and the second electrode layer 514 includes a plurality of electrodes separated from each other, and the other one of the first electrode layer 512 and the second electrode layer 514 includes a common electrode, so that the display medium layer 508 may be controlled via a voltage difference between the electrodes and the common electrode, thereby displaying necessary images. For example, the first electrode layer 512 may include a plurality of electrodes 512a, the second electrode layer 514 includes a common electrode 514a, and vice versa; the present disclosure is not limited thereto. Materials of the first electrode layer 512 and the second electrode layer 514 may include transparent conductive materials such as indium tin oxide, indium zinc oxide or other suitable conductive materials. The display medium layer 508 may for example be similar or identical to the first display medium layer or the second display medium layer of the first embodiment, but the present disclosure is not limited thereto. Materials of the first light-isolation pattern layer 516 and the second light-isolation pattern layer 518 may for example be black materials, white materials or materials with other colors; the black materials may for example include black photoresist materials or black thin film materials, and the white materials may for example include white photoresist materials or white thin film materials, but the present disclosure is not limited thereto. As an example, materials of the first light-isolation pattern layer 516 and the second light-isolation pattern layer 518 may be identical to the materials of the light isolation layer 106 of the first embodiment mentioned above, but the present disclosure is not limited thereto.

The first light-isolation pattern layer 516 is disposed on a surface of the first substrate 102 opposite to the display medium layer 508, the second light-isolation pattern layer 518 is disposed on a surface of the second substrate 104 opposite to the display medium layer 508, and the first light-isolation pattern layer 516 does not overlap at least a portion of the second light-isolation pattern layer 518 in the top-view direction VD. In this manner, the first light-isolation pattern layer 516 may block a portion of the display medium layer 508 at the display surface 1S1, and the second light-isolation pattern layer 518 may block another portion of the display medium layer 508. Practically, the first light-isolation pattern layer 516 may include at least a first opening 516A that overlaps the second light-isolation pattern layer 518 in the top-view direction VD, and the second light-isolation pattern layer 518 may include at least a second opening 518A that overlaps the first light-isolation pattern layer 516 in the top-view direction VD. In the present embodiment, the first light-isolation pattern layer 516 may include a plurality of first openings 516A and a plurality of first light-isolation sections 516B, the second light-isolation pattern layer 518 may include a plurality of second openings 518A and a plurality of second light-isolation sections 518B. Each first light-isolation section 516B overlaps a corresponding second opening 518A in the top-view direction VD, and each second light-isolation section 518B overlaps a corresponding first opening 516A in the top-view direction VD. The electrodes 512a may include a plurality of first electrodes 512a1 and a plurality of second electrodes 512a2. In the top-view direction VD, the first opening 516A and the corresponding second light-isolation section 518B may overlap at least one first electrode 512a1 (such as one first electrode 512a1 shown in FIG. 5) and overlap at least one microcapsule 120 (such as two microcapsules 120 shown in FIG. 5); in the same manner, the second opening 518A and the corresponding first light-isolation section 516B may overlap at least one second electrode 512a2 (such as one second electrode 512a2 shown in FIG. 5) and overlap at least one microcapsule 120 (such as two microcapsules 120 shown in FIG. 5). Therefore, light L1 emitted from below the double-sided e-paper display panel 5 and directed toward the double-sided e-paper display panel 5 would only enter from the first openings 516A, and the first light-isolation sections 516B may block light entering into regions corresponding to the second electrodes 512a2 from below the double-sided e-paper display panel 5. Furthermore, a voltage difference between one of the first electrodes 512a1 corresponding to one of the first openings 516A and a corresponding portion of the common electrode 514a may control the microcapsules 120 therebetween, so that images displayed on the display surface 1S1 of the double-sided e-paper display panel 5 may be displayed through the first openings 516A. Light L2 from above the double-sided e-paper display panel 5 emitted toward the double-sided e-paper display panel 5 may only enter through the second openings 518A, and the second light-isolation sections 518B may block light entering regions corresponding to the first electrodes 512a1 from above the double-sided e-paper display panel 5. Furthermore, a voltage difference between one of the second electrodes 512a2 and a corresponding portion of the common electrode 514a may control the microcapsules 120 therebetween, so that images displayed on the display surface 1S2 of the double-sided e-paper display panel 5 may be displayed through the second openings 518A. Therefore, by disposing the first light-isolation pattern layer 516 on an exterior surface of the first substrate 102 and the second light-isolation pattern layer 518 on an exterior surface of the second substrate 104 allows the double-sided e-paper display panel 5 to display independent images from the display surfaces 1S1, 1S2 that are opposite to each other. Because the double-sided e-paper display panel 5 of the present embodiment only uses a single-layer display medium layer 508, the present embodiment may eliminate two substrates and two electrode layers when compared to the third embodiment and the fourth embodiment, thereby reducing a thickness of the double-sided e-paper display panel 5 in the top-view direction VD, and further reducing the material cost and production cost. In the present disclosure, quantities of the first electrodes 512a1 and the microcapsules 120 corresponding to the same first openings 516A and quantities of the second electrodes 512a2 and the microcapsules 120 corresponding to the same second openings 518A may be correspondingly adjusted depending on practical demands.

It should be noted that, when light at the same grayscale is displayed through the first openings 516A and the second openings 518A, the voltage difference between the first electrodes 512a1 and the common electrode 514a and the voltage difference between the second electrodes 512a2 and the common electrode 514a may be voltage differences that produces complementary grayscales. For example, in 8-bit grayscale (such as from 0 to 255), when light with a grayscale of 0 (such as black) is displayed through the first openings 516A, this region, when viewed from the display surface 1S2, should have a grayscale of 255 (such as white). Therefore, if light with a grayscale of 0 (such as black) is desired at the second openings 518A, this region, when viewed from the display surface 1S1, should have a gray scale of 255 (such as white). As such, when the first openings 516A display a grayscale of 0, the voltage difference between the first electrodes 512a1 and the common electrode 514a may be identical to the voltage difference between the second electrodes 512a2 and the common electrode 514a when the second openings 518A display a gray scale of 255, and so on. Therefore, the first openings 516A and the second openings 518A may be correspondingly driven and controlled to be complementary in color and brightness.

As shown in FIG. 6, when viewed in the top-view direction VD, a top-view pattern of the first light-isolation pattern layer 516 and a top-view pattern of the second light-isolation pattern layer 518 may for example be a checkerboard pattern, a striped pattern or a block pattern, but the present disclosure is not limited thereto. Practically, as shown in examples (i), (ii) and examples (v), (vi) of FIG. 6, the first openings 516A and the first light-isolation sections 516B of the first light-isolation pattern layer 516 and the second openings 518A and the second light-isolation sections 518B of the second light-isolation pattern layer 518 may for example be a striped pattern. In examples (i) and (ii), the first openings 516A, the first light-isolation sections 516B, the second openings 518A and the second light-isolation sections 518B may extend along a first direction D1, wherein the first openings 516A and the first light-isolation sections 516B may be alternately arranged in sequence along a second direction D2, and the second openings 518A and the second light-isolation sections 518B may be alternately arranged in sequence along the second direction D2, but the present disclosure is not limited thereto. In examples (v) and (vi), the first openings 516A, the first light-isolation sections 516B, the second openings 518A and the second light-isolation sections 518B may extend along the second direction D2, wherein the first openings 516A and the first light-isolation sections 516B may be alternately arranged in sequence along the first direction D1, and the second openings 518A and the second light-isolation sections 518B may be alternately arranged in sequence along the first direction D1, but the present disclosure is not limited thereto. In examples (iii) and (iv) of FIG. 6, the first light-isolation sections 516A and the second light-isolation sections 518B may be arranged in a checkerboard pattern, and in the top-view direction VD, the first light-isolation sections 516B are offset from the second light-isolation sections 518B. For example, the first light-isolation sections 516B may be arranged in even columns of odd rows of a matrix and odd columns of even rows of the matrix, whereas the second light-isolation sections 518B may be arranged in odd columns of odd rows of the matrix and even columns of even rows of the matrix, but the present disclosure is not limited thereto. In examples (vii) and (viii) of FIG. 6, the first light-isolation pattern layer 516 may only have a single first opening 516A and a single first light-isolation section 516B, and the first light-isolation section 516B is at a left side of the first opening 516A, whereas the second light-isolation pattern layer 518 may only have a single second opening 518A and a single second light-isolation section 518B, and the second light-isolation section 518B is at aright side of the second opening 518A. In some embodiments, an area of the first light-isolation section 516B and an area of the second light-isolation section 518B may be identical to or different from each other, or a ratio of the area of the first light-isolation section 516B to an area of the first opening 516A and a ratio of the area of the second light-isolation section 518B to an area of the second opening 518A may be identical to or different from each other. The abovementioned top-view patterns of the first light-isolation pattern layer 516 and the second light-isolation pattern layer 518 are illustrative examples; the present disclosure is not limited thereto and may be adjusted depending on practical demands.

Figure 7:
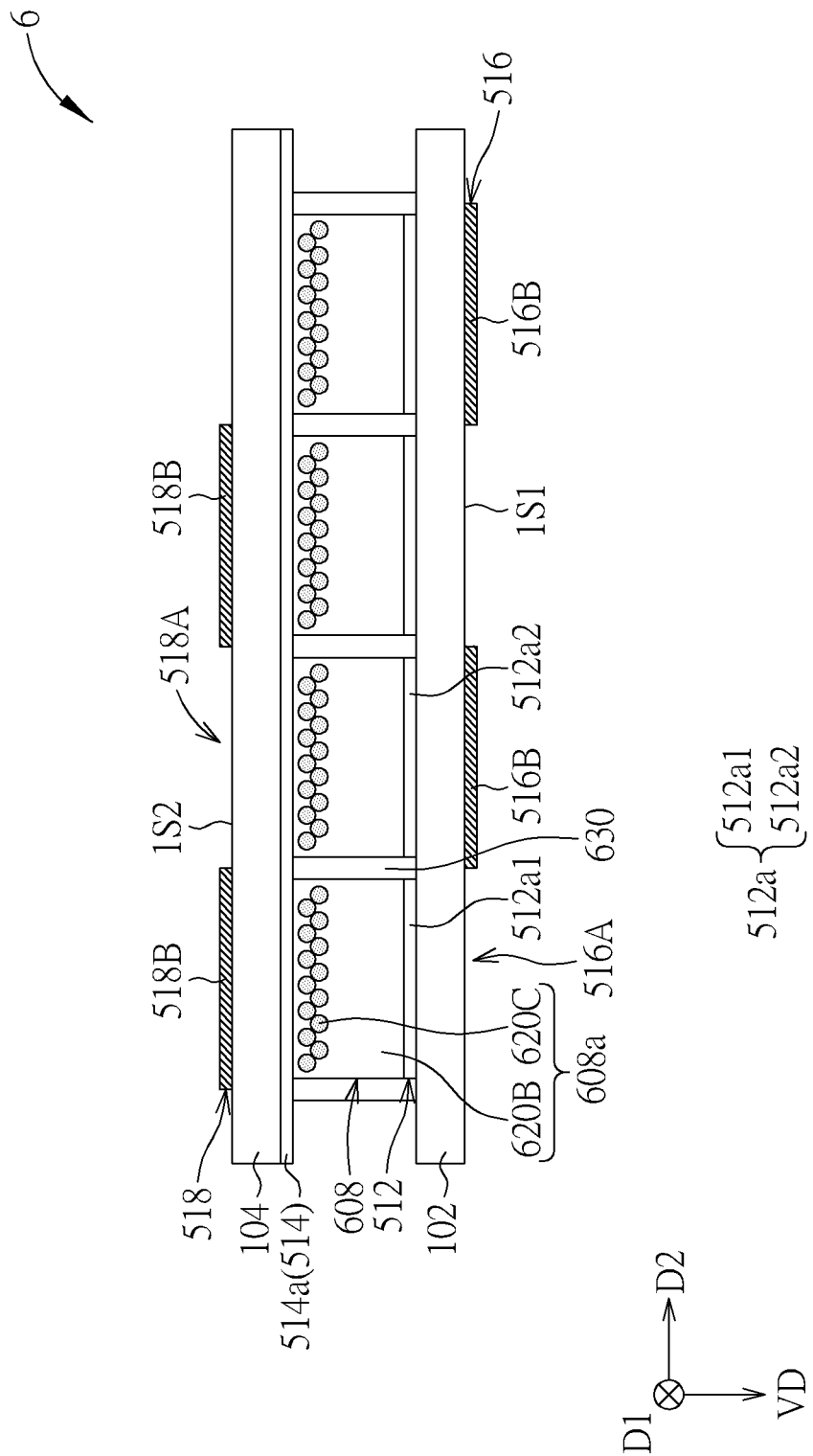
FIG. 7 schematically illustrates a cross-sectional view of the double-sided e-paper display panel according to a sixth embodiment of the present invention (disclosure).

Please refer to FIG. 7, which schematically illustrates a cross-sectional view of the double-sided e-paper display panel according to a sixth embodiment of the present invention (disclosure). As shown in FIG. 7, a double-sided e-paper display panel 6 of the present embodiment differs from the double-sided e-paper display panel 5 of FIG. 5 in that, a fluid 620B and charged particles 620C of a display medium layer 608 are not separated via a shell but via partition walls 630. Practically, the display medium layer 608 may include a plurality of display units 608a, and each display unit 608a may include the fluid 620B and a plurality of the charged particles 620C. For example, a single first light-isolation section 516B (or a single second opening 518A) may overlap at least one display unit 608a in the top-view direction VD, and a single second light-isolation section 518B (or a single first opening 516A) may overlap at least one display unit 608a in the top-view direction VD. In the present embodiment, the double-sided e-paper display panel 6 further includes a plurality of partition walls 630 disposed between the first substrate 102 and the second substrate 104, so that display units may be separated from each other, and the partition wall 630, the first substrate 102 and the second substrate 104 may form a chamber for disposing the fluid 620B and charged particles 620C of the display unit 608A. The partition walls 630 may for example be similar or identical to the first partition wall 430 or the second partition wall 432 of FIG. 4, but the present disclosure is not limited thereto. In some embodiments, the charged particles 620C within the same display unit 608a may be the same type of charges, such as all being positively charged particles or all being negatively charged particles. In such a scenario, the fluid 620B and the charged particles 620C may have different colors, such as black and white. Using positively charged particles 620C as an illustrative example, when a positive voltage provided to the first electrodes 512a1 is higher than a voltage at the common electrode 514a (such as a ground voltage), the charged particles 620C would move closer to the common electrode 514a, thereby causing the display surface 1S1 corresponding to the first openings 516A to display the color in the dark state or close to the dark state; when a negative voltage provided to the first electrodes 512a1 is lower than the voltage at the common electrode 514a (such as a ground voltage), the charged particles 620C would move closer to the first electrodes 512a1, thereby causing the display surface 1S1 corresponding to the first openings 516A to display the color in the bright state or close to the bright state. Conversely, when a positive voltage provided to the second electrodes 512a2 is higher than a voltage at the common electrode 514a, the display surface 1S2 corresponding to the second openings 518A would display the color in the bright state or close to the bright state; when a negative voltage provided to the second electrodes 512a2 is lower than the voltage at the common electrode 514a, the display surface 1S2 corresponding to the second openings 518A would display the color in the dark state or close to the dark state. Therefore, the double-sided e-paper display panel 6 of the present embodiment may for example be a microcup type electrophoretic display panel.

In some embodiments, the fluid 620B may also have different colors that mix into a white color; for example, the fluid 620B within different display units 608a corresponding to the first opening 516A and the second opening 518A may be red, green or blue, but the present disclosure is not limited thereto. In some embodiments, the charged particles 620C within the same display unit 608a may also include positively charged particles and negatively charged particles with different colors, and the fluid 620B may for example be a gas; in such a scenario, the double-sided e-paper display panel 6 may for example be a quick response-liquid power display (QR-LPD) type of e-paper.

Figure 8:
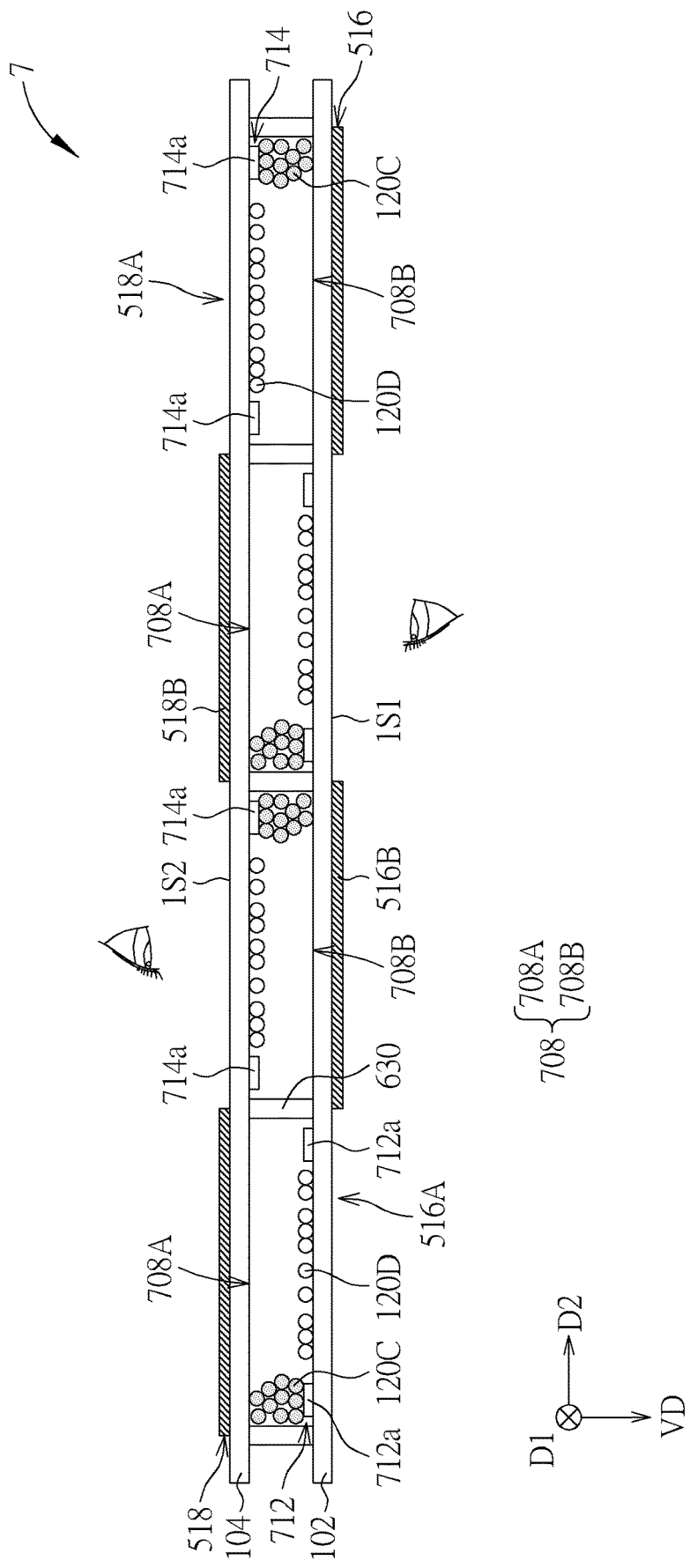
FIG. 8 schematically illustrates a cross-sectional view of the double-sided e-paper display panel according to a seventh embodiment of the present invention (disclosure).

Please refer to FIG. 8, which schematically illustrates a cross-sectional view of the double-sided e-paper display panel according to a seventh embodiment of the present invention (disclosure). As shown in FIG. 8, the double-sided e-paper display panel 7 of the present embodiment differs from the double-sided e-paper display panel 6 of FIG. 7 in that, a first electrode layer 712 and a second electrode layer 714 of the present embodiment may be similar or identical to the first electrode layer 412 and the second electrode layer 414 of FIG. 4, respectively, and may include non-transparent conductive materials, such as metals or other suitable materials. Furthermore, a display medium layer 708 may be similar or identical to the first display medium layer 408 or the second display medium layer 410 of FIG. 4. Practically, the display medium layer 708 may include at least a first display unit 708A and at least a second display unit 708B; in the present embodiment, the display medium layer 708 may include a plurality of first display units 708A and a plurality of second display units 708B, but the present disclosure is not limited thereto. At least one first display unit 708A may correspond to one first opening 516A, and at least one second display unit 708B may correspond to one second opening 518A. The first electrode layer 712 includes a plurality of first electrode pairs separated from each other and corresponding to a single first display unit 708A; each electrode pair may include two first electrodes 712a separated from each other and respectively disposed on the first substrate 102 adjacent to two sides of the corresponding first display unit 708A, such as adjacent to or contacting the partition walls 630 on two sides of the first display unit 708A. The second electrode layer 714 includes a plurality of second electrode pairs separated from each other and corresponding to a single second display unit 708B; each electrode pair may include two second electrodes 714a separated from each other and respectively disposed on the second substrate 104 adjacent to two sides of the corresponding second display unit 708B, such as adjacent to or contacting the partition walls 630 on two sides of the second display unit 708B. Furthermore, the charged particles of the first display unit 708A and the second display unit 708B may include positively charged particles 120C and negatively charged particles 120D with different colors. By adjusting a magnitude of the voltage difference between the first electrodes 712a, a time duration to apply the voltage difference, a number of times to apply the voltage difference or a timing sequence of the voltage difference, relations between quantities and distributions of the positively charged particles 120C and the negatively charged particles 120D of the first display unit 708A may be controlled, so as to display corresponding colors and grayscales on the display surface 1S1. In the same manner, by adjusting a magnitude of the voltage difference between the second electrodes 714a and a time duration to apply the voltage difference, relations between quantities and distributions of the positively charged particles 120C and the negatively charged particles 120D of the second display unit 708B may be controlled, so as to display corresponding colors and grayscales on the display surface 1S2. Because the positively charged particles 120C and the negatively charged particles 120D of the first display unit 708A and the second display unit 708B may be controlled in a similar or identical manner as the first display unit 408A of FIG. 4, descriptions regarding such controlling manner will be omitted for brevity.

Figure 9:
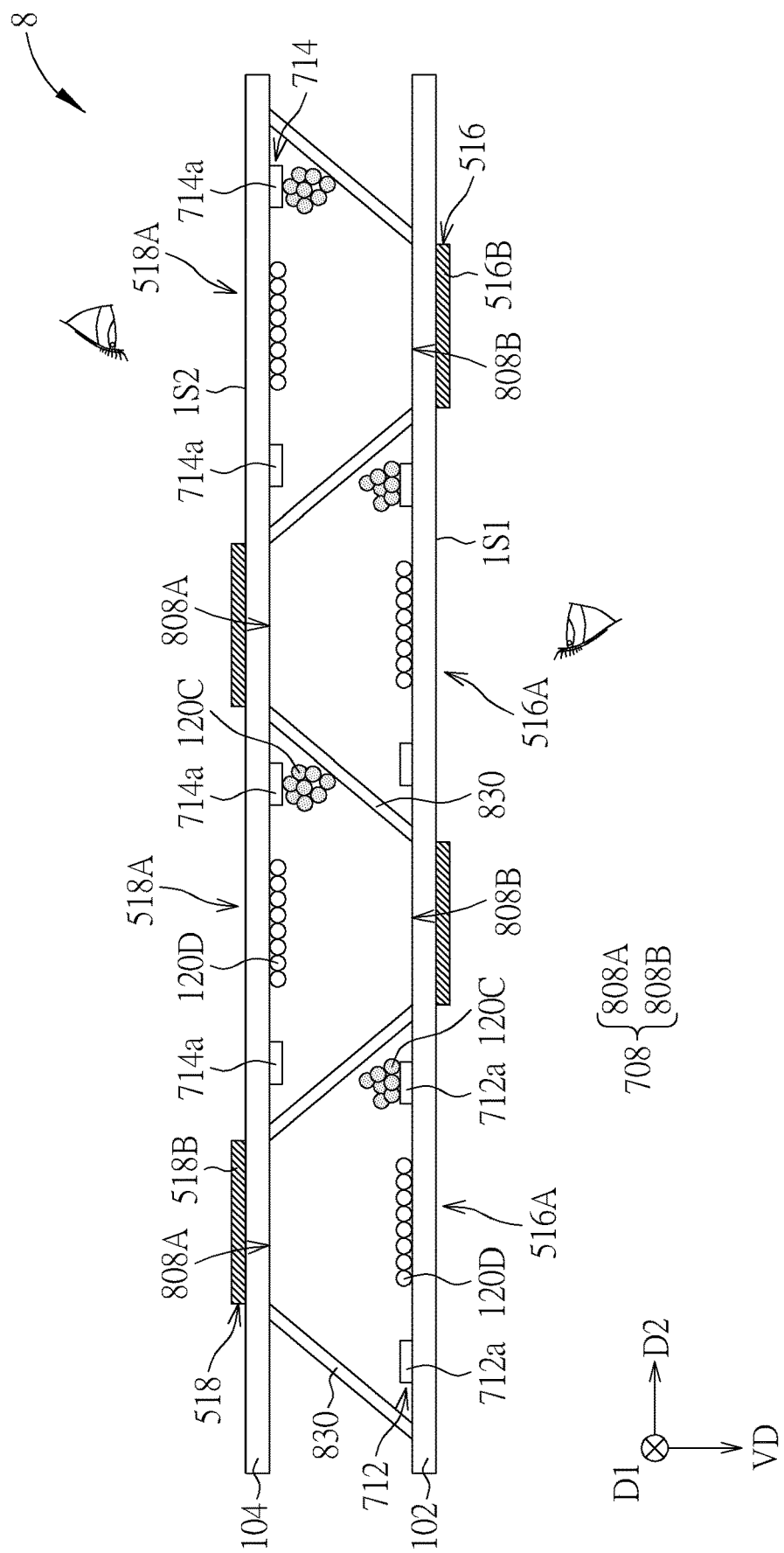
FIG. 9 schematically illustrates a cross-sectional view of the double-sided e-paper display panel according to an eighth embodiment of the present invention (disclosure).

Please refer to FIG. 9, which schematically illustrates a cross-sectional view of the double-sided e-paper display panel according to an eighth embodiment of the present invention (disclosure). As shown in FIG. 9, a double-sided e-paper display panel 8 of the present embodiment differs from the double-sided e-paper display panel 7 of FIG. 8 in that, a cross-sectional shape of the first openings 516A corresponding to a first display unit 808A may be a trapezoid, and a cross-sectional shape of the second openings 518A corresponding to a second display unit 808B may be an inverted trapezoid. For example, an extending direction of a partition wall 830 between neighboring first display unit 808A and second display unit 808B may not be parallel to the top-view direction VD, but the extending direction and the top-view direction VD may have an included angle of greater than 0 degrees and less than 90 degrees. Therefore, the partition walls 830 and the second substrate 104 or the first substrate 102 may form a recess having a wide opening and a narrow bottom. In such manner, a surface area of the first display unit 808A adjacent to the display surface 1S1 may be greater than a surface area of the first display unit 808A adjacent to the second light-isolation section 518B, and a surface area of the second display unit 808B adjacent to the display surface 1S2 may be greater than a surface area of the second display unit 808B adjacent to the first light-isolation section 516B. In other words, the area of the first light-isolation section 516B may be less than the corresponding area of the second opening 518A, and the area of the second light-isolation section 518B may be less than the corresponding area of the first opening 516A. Therefore, brightness of light entering and exiting the first opening 516A and the second opening 518A may be increased, thereby improving an image contrast ratio or color saturation of the double-sided e-paper display panel 8. In some embodiments, reflective layers may be disposed on surfaces of the partition walls 830 facing the first display units 808A and the second display units 808B, or reflective layers may be disposed on a surface of the first light-isolation pattern layer 516 facing the first substrate 102 and a surface of the second light-isolation pattern layer 518 facing the second substrate 104; in this manner, light through the first display unit 808A and the second display unit 808B may be reflected, so as to increase brightness of light emitted from the first opening 516A and the second opening 518A.

Figure 10:
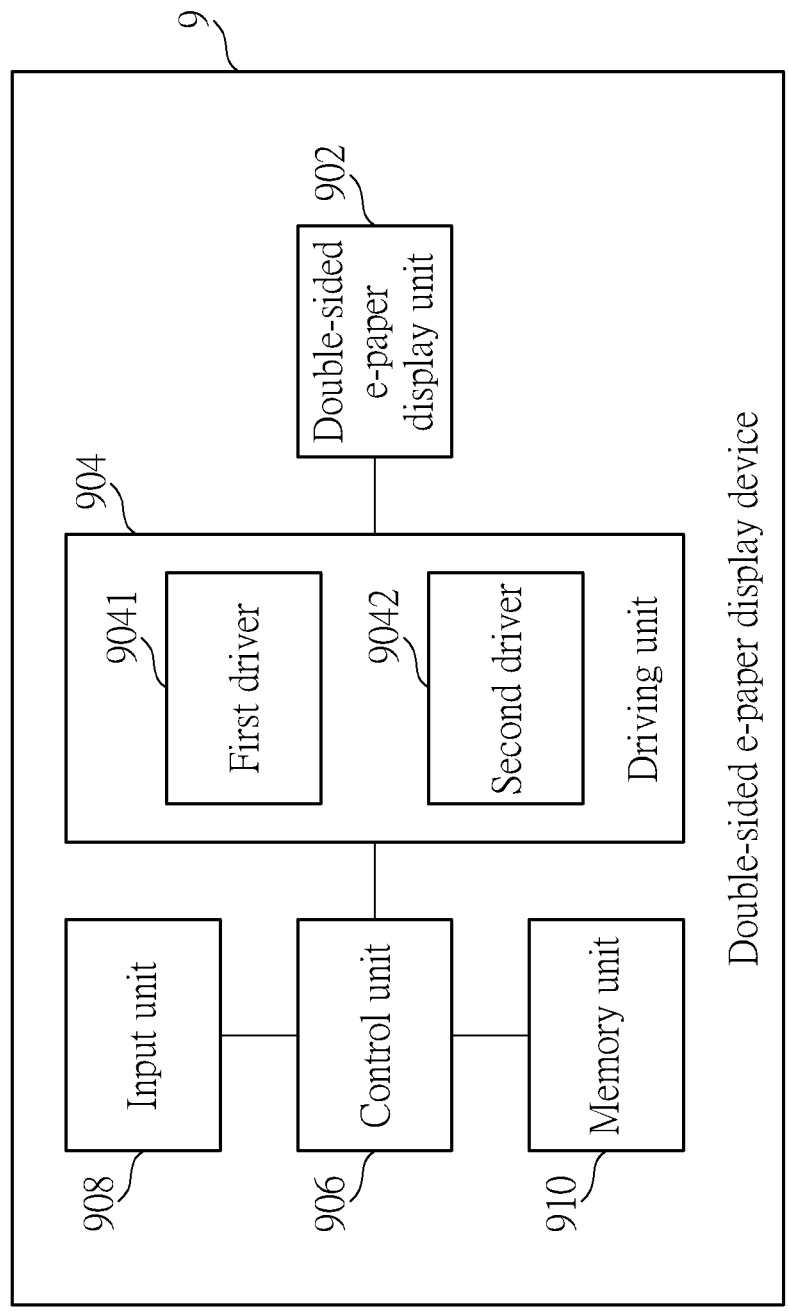
FIG. 10 schematically illustrates a block diagram of a double-sided e-paper display device according to an embodiment of the present invention (disclosure).

A display device utilizing the double-sided e-paper display panel of the aforementioned embodiments and its operating method will be further mentioned in the following description. Please refer to FIG. 10, which schematically illustrates a block diagram of a double-sided e-paper display device according to an embodiment of the present invention (disclosure). As shown in FIG. 10, the double-sided e-paper display device 9 of the present embodiment may include a double-sided e-paper display unit 902, a driving unit 904, a control unit 906, an input unit 908 and a memory unit 910. The double-sided e-paper display unit 902 may for example be any one of the double-sided e-paper display panel of the aforementioned embodiments or a combination double-sided e-paper display panel of at least two of the aforementioned embodiments, but the present disclosure is not limited thereto. The driving unit 904 is electrically connected between the control unit 906 and the double-sided e-paper display unit 902, and may be used to drive the double-sided e-paper display unit 902 and control voltages of the electrodes. The memory unit 910 is electrically connected to the control unit 906, and may be used to store executable programs, store processed data within the executable programs, or store configuration data or other data that need to be stored or temporary stored. The input unit 908 is electrically connected to the control unit 906, and may for example be a unit for inputting display information and used to receive display information to be displayed on a single display surface or display information to be displayed simultaneously on two display surfaces. For example, an interface of the input unit 908 for connecting to an external environment may for example include wired input interface, such as video graphics array (VGA), high definition multimedia interface (HDMI), digital visual interface (DVI), DisplayPort, universal serial bus (USB) or other suitable wired transmitting interfaces, or wireless input interface, such as wireless network (WiFi), Bluetooth, 5G communication, optical communication or other wireless transmitting interfaces, but the present disclosure is not limited thereto. The control unit 906 may execute programs within the memory unit 910, acquire display information from the memory unit 910 via the input unit 908 and drive the double-sided e-paper display unit 902 via the driving unit 904. The control unit 906 may determine whether the display information is displayed on one of display surfaces of the double-sided e-paper display unit 902 or on both display surfaces simultaneously. When the display information is displayed on two display surfaces, images displayed on two display surfaces may be identical or different from each other. In some embodiments, the driving unit 904 may include a first driver 9041 and a second driver 9042, wherein the first driver 9041 may be used to drive structures of the double-sided e-paper display unit 902 for displaying images from one display surface, and the second driver 9042 may be used to drive structures of the double-sided e-paper display unit 902 for displaying images from another display surface, thereby simplifying processes of the drivers. Using the double-sided e-paper display panel 1 of FIG. 1 as an illustrative example, the first driver 9041 may provide voltages to the first electrode layer 112 and drive the first display medium layer 108, and the second driver 9042 may provide voltages to the second electrode layer 114 and drive the second display medium layer 110. Using the double-sided e-paper display panel 5 of FIG. 5 as an illustrative example, the first driver 9041 may provide voltages to the first electrodes 512a1 corresponding to the first openings 516A, and the second driver 9042 may provide voltages to the second electrodes 512a2 corresponding to the second openings 518A.

Figure 11:
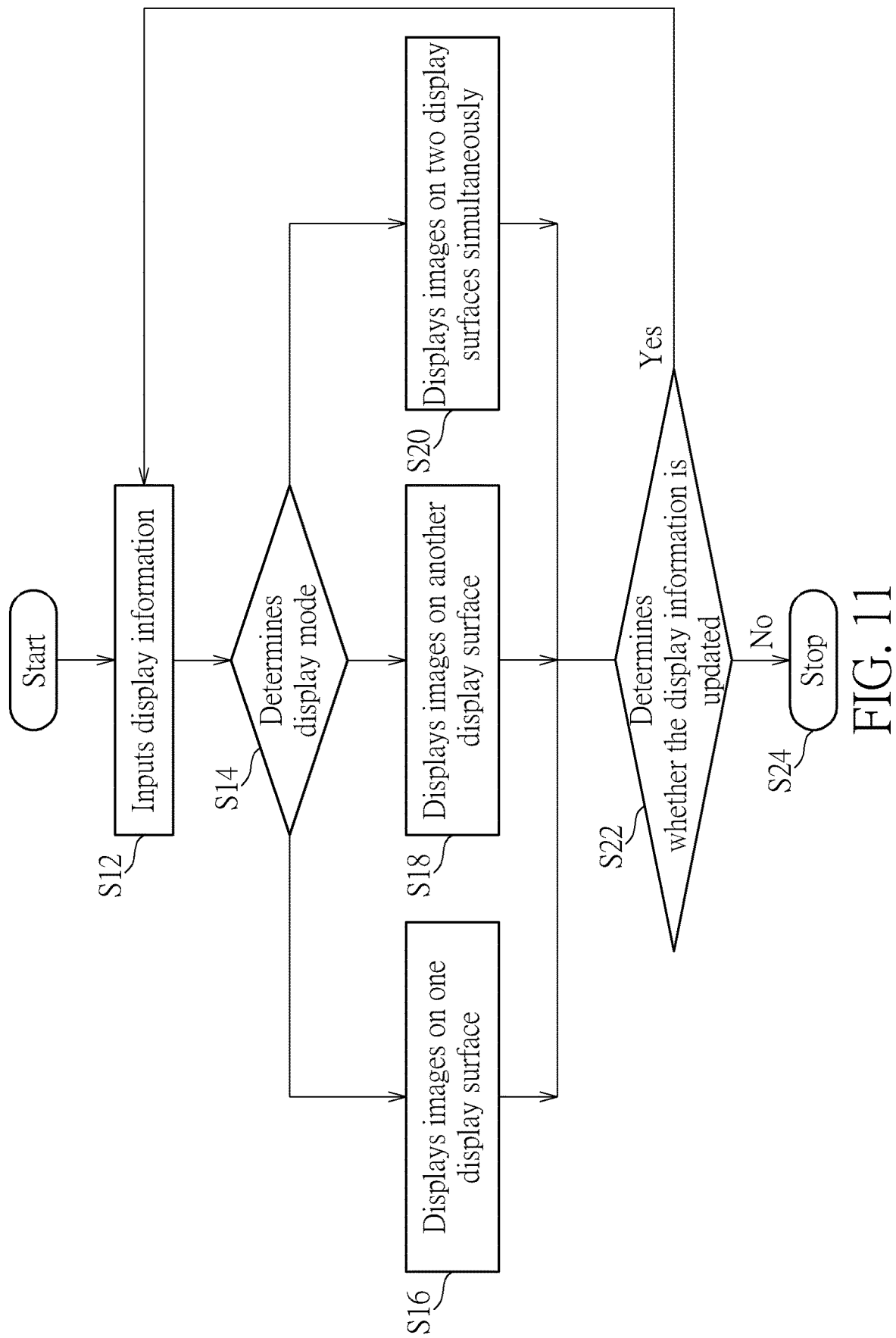
FIG. 11 schematically illustrates a flowchart of an operating method of the double-sided e-paper display device according to an embodiment of the present invention (disclosure).

Please refer to FIG. 11, which schematically illustrates a flowchart of an operating method of the double-sided e-paper display device according to an embodiment of the present invention (disclosure). As shown in FIG. 11, an operating method of the double-sided e-paper display device of the present embodiment may include steps S12 to S24. In the description below, the double-sided e-paper display device 9 of FIG. 10, wherein the double-sided e-paper display unit 902 is exemplified using the double-sided e-paper display panel 5 of FIG. 5, will be further described, but the present disclosure is not limited thereto. The operating method of the present embodiment may be suitable for the double-sided e-paper display panels of the aforementioned other embodiments. First, starting at step S12, display information is inputted such that the control unit 906 may receive the display information via the input unit 908. Next, step S14 is performed: when the control unit 906 receives the display information, the control unit 906 may determine which display mode should be used on the double-sided e-paper display panel 5 based on the display information, wherein the display modes may be categorized as a first single-sided display mode, a second single-sided display mode and a double-sided display mode.

When the display information may include a first display information displayed on the display surface 1S1, the control unit 906 may determine the display mode to be the first single-sided display mode and perform step S16, in which the control unit 906 may, based on the first display information, drive the double-sided e-paper display unit 902 via the driving unit 904 (such as the first driver 9041), so as to display images on the display surface 1S1 of the double-sided e-paper display unit 902. For example, the first driver 9041 may, based on the first display information, provide corresponding voltages to the first electrodes 512a1 to control the black positively charged particles 120C and the white negatively charged particles 120D corresponding to the first electrodes 512a1. The second driver 9042 may provide positive voltages to the second electrodes 512a2 to attract the white negatively charged particles 120D, so that the black positively charged particles 120C move closer to the display surface 1S2, thereby showing the dark state on the display surface 1S2 without displaying images.

When the display information may include a second display information displayed on the display surface 1S2, the control unit 906 may determine the display mode to be the second single-sided display mode and perform step S18, in which the control unit 906 may, based on the second display information, drive the double-sided e-paper display unit 902 via the driving unit 904 (such as the second driver 9042), so as to display images on the display surface 1S2 of the double-sided e-paper display unit 902. In this mode, the first driver 9041 may provide negative voltages to the first electrodes 512a1 to attract the black positively charged particles 120C, thereby showing the dark state on the display surface 1S1 without displaying images.

When the display information includes the first display information on the display surface 1S1 and the second display information on the display surface 1S2, the control unit 906 determines the display mode to be a double-sided display mode and perform step S20, in which the control unit 906 may, based on the first display information and the second display information, drive the double-sided e-paper display unit 902 via the driving unit 904 (such as the first driver 9041 and the second driver 9042), so as to display images on the display surfaces 1S1, 1S2 of the double-sided e-paper display unit 902. The first display information and the second display information may for example include positions of pixels or sub-pixels, colors, and brightness levels, but the present disclosure is not limited thereto.

In some embodiments, when the double-sided e-paper display unit 902 is any one of the aforementioned embodiments of FIG. 5 and FIG. 7, voltage differences provided by the first driver 9041 and the second driver 9042 are voltage differences of complementary grayscale, so as to display corresponding images. In some embodiments, the driving unit 904 may not include the first driver 9041 and the second driver 9042, but use a control program to drive structures for display images from the two display surfaces is stored in the memory unit 910. In such scenario, when the double-sided e-paper display unit 902 is any one of the aforementioned embodiments of FIG. 5 and FIG. 7, the memory unit 910 may include a conversion program of complimentary voltages, so that the control unit 906 may, based on such conversion program, provide voltages to the first electrodes 512a1 and the second electrodes 512a2 to display corresponding images.

After steps S16, S18 and S20, step S22 is performed: the control unit 906 determines whether the display information is updated; that is, the control unit 906 determines whether the input unit 908 receives another display information. When the control unit 906 determines the input unit 908 receives another display information, that is, an updated display information, step S12 and subsequent steps are repeated. When the control unit 906 determines the input unit 908 does not receive another display information, step S24 is performed: the double-sided e-paper display unit 902 is stopped from being driven. That is, a driving voltage is no longer provided to the double-sided e-paper display unit 902 via the driving unit 904. Because the charged particles of the double-sided e-paper display unit 902 do not change positions when a voltage is no longer applied to the electrodes, the double-sided e-paper display unit 902 may still continue to display images corresponding to the original display information.

In summary, in the double-sided e-paper display panel of the present invention, since the display surfaces opposite to each other may display independent images, more applications of the double-sided e-paper display panel are available. Furthermore, because the double-sided e-paper display panel only uses a single light isolation layer or a single display medium layer, the thickness in the top-view direction may be reduced, thereby further reducing the material cost and production cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A double-sided e-paper display panel comprising:
   a first substrate;
   a second substrate disposed opposite to the first substrate;
   a light isolation layer disposed between the first substrate and the second substrate;
   a first display medium layer disposed between the first substrate and the light isolation layer;
   a second display medium layer disposed between the light isolation layer and the second substrate, wherein the first display medium layer and the second display medium layer comprise a fluid and a plurality of charged particles;
   a first electrode layer disposed between the first substrate and the first display medium layer; and
   a second electrode layer disposed between the second display medium layer and the second substrate,
   wherein the first display medium layer comprises a first display unit, the first electrode layer comprises two first electrodes disposed adjacent to two sides of the first display unit, the second display medium layer comprises a second display unit, the second electrode layer comprises two second electrodes disposed adjacent to two sides of the second display unit, and the first electrode layer and the second electrode layer comprise a non-transparent conductive material.

2. An operating method of a display device, wherein the display device comprises a double-sided e-paper display unit, a control unit, a driving unit and an input unit, the control unit is electrically connected to the double-sided e-paper display unit via the driving unit, and the input unit is electrically connected to the control unit, the operating method comprises:
   receiving display information via the input unit;
   determining a display mode of the double-sided e-paper display unit via the control unit based on the display information;
   when the control unit determines the display mode to be a single-sided display mode, driving the double-sided e-paper display unit via the driving unit based on the display information to display an image on a display surface of the double-sided e-paper display unit; and
   when the control unit determines the display mode to be a double-sided display mode, driving the double-sided e-paper display unit via the driving unit based on the display information to display images on the display surface and another display surface of the double-sided e-paper display unit,
   wherein the double-sided e-paper display unit comprising:
   a first substrate;
   a second substrate disposed opposite to the first substrate;
   a light isolation layer disposed between the first substrate and the second substrate;
   a first display medium layer disposed between the first substrate and the light isolation layer;
   a second display medium layer disposed between the light isolation layer and the second substrate, wherein the first display medium layer and the second display medium layer comprise a fluid and a plurality of charged particles;

a first electrode layer disposed between the first substrate and the first display medium layer; and a second electrode layer disposed between the second display medium layer and the second substrate, wherein the first display medium layer comprises a first display unit, the first electrode layer comprises two first electrodes disposed adjacent to two sides of the first display unit, the second display medium layer comprises a second display unit, the second electrode layer comprises two second electrodes disposed adjacent to two sides of the second display unit, and the first electrode layer and the second electrode layer comprise a non-transparent conductive material.

3. The operating method of the display device according to claim 2, further comprising:

determining whether the input unit receives another display information via the control unit, and when the control unit determines that the input unit does not receive the another display information, stopping driving the double-sided e-paper display unit.

* * * * *